(12) United States Patent
Maeda et al.

(10) Patent No.: US 9,044,821 B2
(45) Date of Patent: Jun. 2, 2015

(54) ANTIOXIDANT GAS SUPPLY UNIT

(71) Applicant: Shinkawa Ltd., Tokyo (JP)

(72) Inventors: Toru Maeda, Tokyo (JP); Mitsuaki Sakakura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/321,134

(22) Filed: Jul. 1, 2014

(65) Prior Publication Data

US 2014/0311590 A1 Oct. 23, 2014

Related U.S. Application Data

(63) Continuation of application No. PCT/JP2012/081135, filed on Nov. 30, 2012.

(30) Foreign Application Priority Data

Jan. 26, 2012 (JP) ................................ 2012-014236

(51) Int. Cl.
B23K 37/00 (2006.01)
B23K 20/00 (2006.01)
B23K 9/16 (2006.01)
H01L 23/00 (2006.01)

(52) U.S. Cl.
CPC ............... *B23K 20/007* (2013.01); *B23K 9/16* (2013.01); *B23K 20/005* (2013.01); *H01L 24/78* (2013.01); *H01L 2224/78301* (2013.01); *H01L 2224/85045* (2013.01); *H01L 2224/78268* (2013.01); *H01L 2224/781* (2013.01); *H01L 24/45* (2013.01); *H01L 2224/45147* (2013.01); *H01L 2224/85054* (2013.01); *H01L 2924/00015* (2013.01); *H01L 2924/00014* (2013.01); *B23K 37/00* (2013.01)

(58) Field of Classification Search
None
See application file for complete search history.

(56) References Cited

U.S. PATENT DOCUMENTS

| 4,976,393 | A | 12/1990 | Nakajima et al. |
| 6,180,891 | B1 * | 1/2001 | Murdeshwar ................. 174/260 |
| 7,614,538 | B2 * | 11/2009 | Gillotti et al. .................. 228/4.5 |

(Continued)

FOREIGN PATENT DOCUMENTS

| JP | 59-72730 | 5/1984 |
| JP | 63-147338 | 6/1988 |

(Continued)

OTHER PUBLICATIONS

International Search Report dated Feb. 26, 2013, from corresponding International Application No. PCT/JP2012/081135.

(Continued)

*Primary Examiner* — Kiley Stoner
(74) *Attorney, Agent, or Firm* — Katten Muchin Rosenman LLP

(57) ABSTRACT

Provided is an antioxidant gas supply unit including: a base body (10) in a shape of a hollow plate having antioxidant gas flow paths (53) and (54) defined therein; an antioxidation gas inlet (20) for letting an antioxidant gas flow into the antioxidant gas flow paths (53) and (54); a through hole (30) penetrating through the base body (10) in a through-thickness direction so that a capillary (72) is allowed to be inserted into and removed from the hole, and communicating with the antioxidant gas flow paths (53) and (54) to let the antioxidant gas flow out; and a film heater (40) attached to an outer surface of the base body (10) around the through hole (30). The antioxidant gas supply unit has a compact structure and is capable of effectively heating a free air ball.

8 Claims, 8 Drawing Sheets

(56) References Cited

U.S. PATENT DOCUMENTS

| | | | |
|---|---|---|---|
| 7,628,307 B2* | 12/2009 | Wong et al. | 228/4.5 |
| 8,186,562 B1* | 5/2012 | Song et al. | 228/4.5 |
| 8,313,015 B2* | 11/2012 | Gillotti et al. | 228/4.5 |
| 2003/0019906 A1* | 1/2003 | Sakai et al. | 228/1.1 |
| 2008/0035709 A1* | 2/2008 | Nishiura et al. | 228/176 |
| 2009/0134201 A1* | 5/2009 | Jindo et al. | 228/42 |
| 2010/0078464 A1* | 4/2010 | Nishiura | 228/220 |
| 2010/0230476 A1 | 9/2010 | Gillotti et al. | |
| 2011/0277861 A1* | 11/2011 | Liu | 137/583 |
| 2014/0332583 A1* | 11/2014 | Maeda | 228/4.5 |

FOREIGN PATENT DOCUMENTS

| | | | |
|---|---|---|---|
| JP | 63147338 A * | 6/1988 | H01L 21/60 |
| JP | 63-164230 | 7/1988 | |
| JP | 63-266845 | 11/1988 | |
| JP | 2007-294975 | 11/2007 | |
| JP | 2008-130825 | 6/2008 | |

OTHER PUBLICATIONS

International Search Report and Written Opinion dated Feb. 26, 2013, from the corresponding PCT/JP2012/081135.

* cited by examiner

ANTIOXIDANT GAS SUPPLY UNIT

TECHNICAL FIELD

The present invention relates to a structure of an antioxidant gas supply unit attached to a wire bonding apparatus.

BACKGROUND ART

Many wire bonding apparatuses employ ball bonding of forming a wire tail extending from a tip of a capillary as a bonding tool into a free air ball by a spark, and bonding the free air ball onto an electrode of a semiconductor device or a substrate using the tip of the capillary.

Gold wires conventionally used to be widely employed in wire bonding, but bonding using copper wires that are less expensive and superior in electric properties have become increasingly more common. However, unlike gold wires, copper wire are susceptible to oxidation, and resulting in an oxidation film formed over a surface of a free air ball when forming the ball by a spark. The oxidation film often causes deterioration in attachment between the ball and an electrode, and thus in poor bonding. Therefore, there is proposed a method of suppressing oxidation of a surface of a free air ball when bonding is performed using copper wires by, for example, forming the ball in an inert gas such as a nitrogen gas or an argon gas (see PTL 1, for example).

However, when blowing an inert gas in one direction to an area in which a free air ball is formed as in a case of a bonding apparatus described in PTL 1, there are problems that decentering may occur in the formed free air ball due to a flow of the inert gas, and that oxidation may occur due to air coming into the area in which the free air ball is formed. Accordingly, there is proposed a method of providing a porous component around a cavity in which the free air ball is formed, decreasing the speed of the inert gas with fine halls in the porous component, and causing the inert gas to be spread evenly within the cavity (see PTL 2, for example).

In contrast, if the temperature of the surface of the free air ball decreases when bonding, there are problems such that bond strength between the free air ball and an electrode may deteriorate, and that irregularities occur in the shape of the free air ball (not rounded, for example). Accordingly, there is proposed a method of ensuring bonding strength by causing a heated reducing gas to flow around a free air ball before, during, and after forming the free air ball to keep the temperature of the free air ball high (see PTL 3, for example). Further, there is proposed a method of performing bonding while suppressing oxidation of a surface of a free air ball and maintaining the temperature of the free air ball high by forming the free air ball in a state in which a heated inert gas flows (see PTL 4, for example).

However, when a structure in which a heated inert gas is sprayed from a gas nozzle is employed as in the conventional techniques described in PTLs 3 and 4, it is necessary to increase a flow rate of the inert gas in order to maintain an atmosphere of the inert gas. Accordingly, there are problems that a large heater for heating an inert gas becomes necessary, and this adversely increases the size of a bonding apparatus, or results in slow operation, making it difficult to perform bonding at high speed.

CITATION LIST

Patent Literatures

PTL 1: Japanese Unexamined Patent Application Publication No. 2007-294975

PTL 2: Japanese Unexamined Patent Application Publication No. 2008-130825

PTL 3: Japanese Unexamined Patent Application Publication No. S63-164230

PTL 4: Japanese Unexamined Patent Application Publication No. S63-266845

SUMMARY OF INVENTION

Technical Problem

Thus, an object of the present invention is to provide an antioxidant gas supply unit having a compact structure and capable of effectively heating a free air ball.

Solution to Problem

An antioxidant gas supply unit according to the present invention is provided with: a base body in a shape of a hollow plate having an antioxidant gas flow path defined therein; a through hole penetrating through the base body in a through-thickness direction so that a capillary is allowed to be inserted into and removed from the hole, and communicating with the antioxidant gas flow path to let an antioxidant gas flow out; and a film heater attached to an outer surface of the base body around the through hole.

The antioxidant gas supply unit according to the present invention can preferably be configured such that the antioxidant gas flow path includes a plurality of air outlets for blowing the antioxidant gas toward the center of the through hole. The antioxidant gas supply unit according to the present invention may be further provided with: an antioxidation gas inlet for letting the antioxidant gas flow into the antioxidant gas flow path, wherein the antioxidant gas flow path includes a labyrinth for changing a flow direction at least two times and provided between the antioxidation gas inlet and the air outlets.

Further, the antioxidant gas supply unit according to the present invention may preferably be configured such that the labyrinth includes: a plurality of inner circumferential blocks arranged around a peripheral rim of the through hole, gaps between the blocks in a circumferential direction constituting the air outlets, respectively; and a plurality of outer circumferential blocks arranged on a side of an outer circumference of the inner circumferential blocks such that gaps between the blocks in the circumferential direction are displaced along the circumferential direction from the gaps between the inner circumferential blocks.

Moreover, the antioxidant gas supply unit according to the present invention can preferably be configured such that the film heater is attached to the outer surface of the base body in an area in which the labyrinth is disposed, such that an electrode is disposed outside the base body, the electrode being provided for causing a spark between the electrode and a wire tail extending from a tip of the capillary to form the wire tail into a free air ball, or such that the electrode is disposed within the base body.

Advantageous Effects of Invention

The present invention provides an advantageous effect of providing an antioxidant gas supply unit having a compact structure and capable of effectively heating a free air ball.

DESCRIPTION OF EMBODIMENTS

Figure 1:
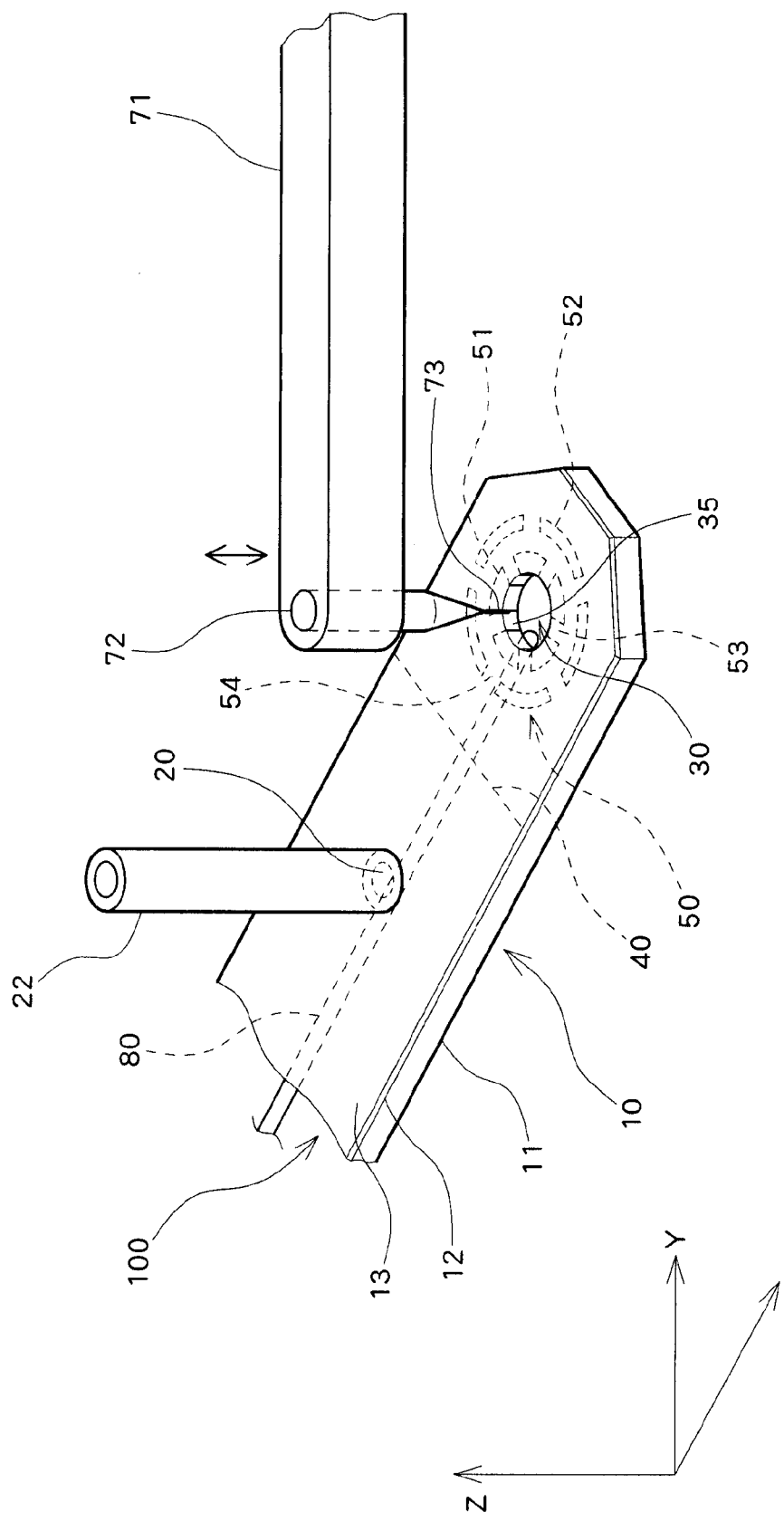
FIG. 1 is a perspective view illustrating a wire bonding apparatus to which an antioxidant gas supply unit according to an embodiment of the present invention is attached.

Hereinafter, embodiments of the present invention will be described with reference to the drawings. Referring to FIG. 1, an antioxidant gas supply unit 100 according to embodiments includes: a base body 10 in a shape of a hollow plate having antioxidant gas flow paths 53 and 54 defined therein; an antioxidation gas inlet 20 for letting an antioxidant gas flow into the antioxidant gas flow paths 53 and 54; a through hole 30 penetrating through the base body 10 in a through-thickness direction so that a capillary 72 is allowed to be inserted into and removed from the hole, and communicating with the antioxidant gas flow paths 53 and 54 to let the antioxidant gas flow out; and a film heater 40 attached to an outer surface of the base body 10 around the through hole 30. The antioxidant gas flow path 53 is provided with a plurality of air outlets 35 for letting the antioxidant gas blow out toward the center of the through hole 30. Further, the antioxidant gas flow paths 53 and 54 include a labyrinth 50 for changing a flow direction at least two times and provided between the antioxidation gas inlet 20 and the air outlets 35. The labyrinth 50 includes a plurality of inner circumferential blocks 51 arranged around a peripheral rim of the through hole 30 and a plurality of outer circumferential blocks 52, and gaps between the blocks 51 and gaps between the blocks 52 in a circumferential direction respectively constitute the antioxidant gas flow paths 53 and 54. Further, to an outer surface of a region where the labyrinth 50 of the base body 10 is provided, the film heater 40 configured to heat the antioxidant gas flowing through the antioxidant gas flow paths 53 and 54 is attached. In addition, under the base body 10, there is provided an electrode 80 for causing a spark between the electrode and the wire tail 73 extending from a tip of the capillary 72 to form the wire tail 73 into a free air ball.

When performing a bonding operation, the capillary 72 is moved by a bonding arm 71 in a vertical direction and presses the free air ball formed at the tip of the capillary 72 against an electrode of a semiconductor die or a substrate to join (bond) the wire to the electrode. The antioxidant gas supply unit 100 is attached to a bonding head (not depicted) to which the bonding arm 71 is attached, and moves in X and Y directions along with the bonding arm 71 and the capillary 72. The antioxidant gas can be an inert gas such as nitrogen or argon, or can be a gas in which a reducing gas such as hydrogen is mixed, for example.

Figure 2:
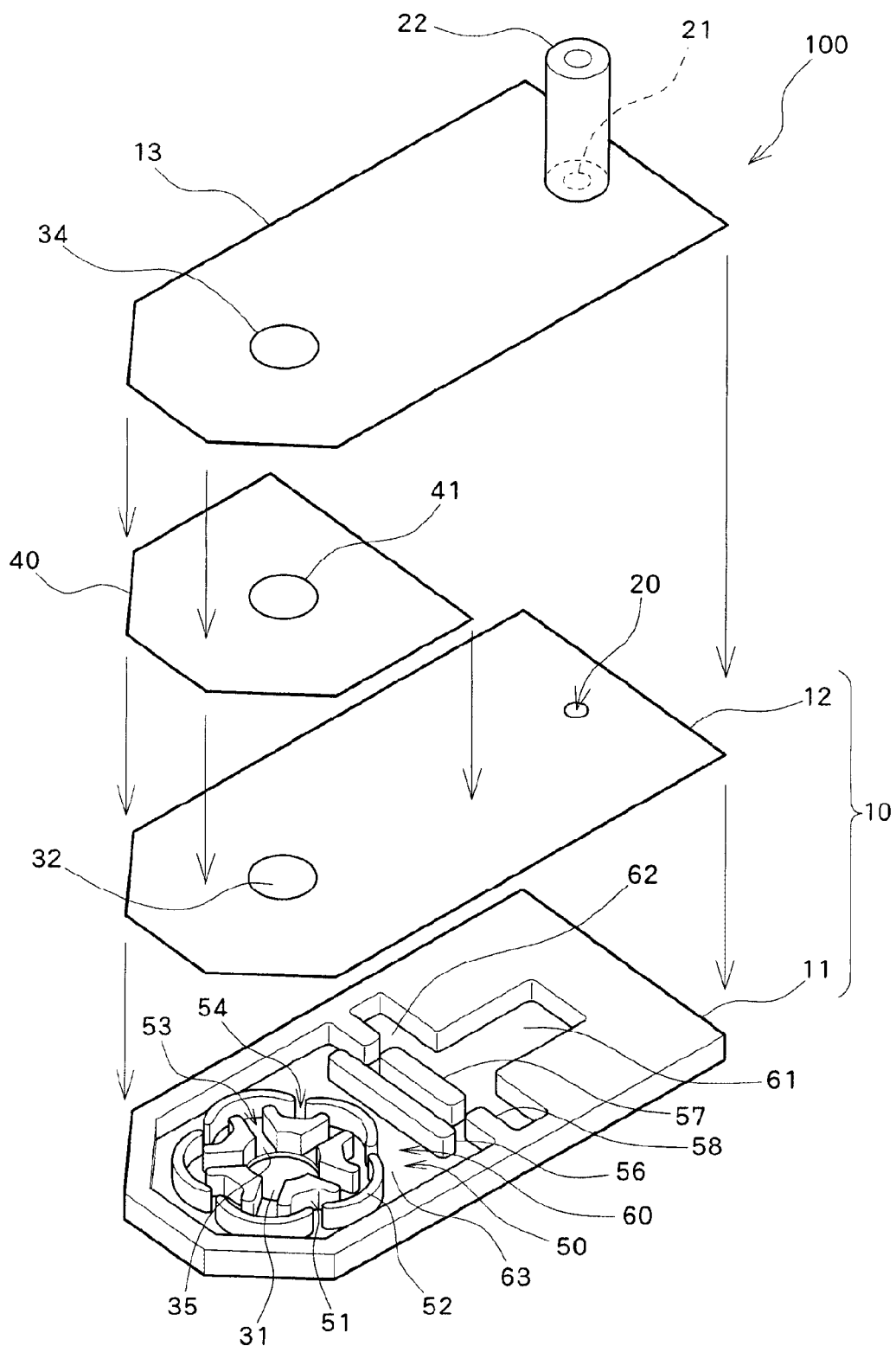
FIG. 2 is a perspective view illustrating a structure of the antioxidant gas supply unit according to the embodiment of the present invention.

The antioxidant gas supply unit 100 will be described in detail with reference to FIG. 2. The base body 10 includes: a main body 11 provided with a depressed portion 60 therein; and a cover 12 provided above the main body 11 and defines a hollow portion in which the antioxidant gas flows together with the depressed portion 60 in the main body 11. The film heater 40 is provided above the cover 12 of the base body 10, and a cover plate 13 is provided above the film heater 40. The cover 12 is provided with the antioxidation gas inlet 20 for letting the antioxidant gas flow into the depressed portion 60 of the main body 11, and the cover plate 13 is provided with a gas hole 21 communicating with the antioxidation gas inlet 20 at a position corresponding to the antioxidation gas inlet 20 in the cover 12. To the gas hole 21 of the cover plate 13, the antioxidant gas introducing tube 22 for introducing the antioxidant gas is attached. Further, the main body 11, the cover 12, the film heater 40, and the cover plate 13 are respectively provided with holes 31, 32, 41, and 34 through which the capillary 72 is inserted. In this embodiment, the main body 11, the cover 12, and the cover plate 13 are made of ceramic, and as illustrated in FIG. 2, the main body 11, the cover 12, the film heater 40, and the cover plate 13 are laminated and sintered, or assembled by an adhesive agent in the stated order.

The depressed portion 60 defined within the main body 11 includes three areas: a narrow-width entrance area 61 communicating with the antioxidation gas inlet 20 in the cover 12; a wide-width middle area 62 on a side of the antioxidation gas inlet 20 from projections 58 that extend in a crosswise direction from either side; and a labyrinth area 63 on a side of the hole 31 from the projections 58. The labyrinth area 63 of the depressed portion 60 is provided with the hole 31 through which the capillary 72 is inserted and removed, as well as the plurality of inner circumferential blocks 51 extending upright from a bottom surface of the depressed portion 60, the plurality of outer circumferential blocks 52 provided on an outer circumferential side of the inner circumferential blocks 51 and extending upright from the bottom surface of the depressed portion 60, a cuboid first entrance-side block 57 arranged in series with the projections 58 and extending upright from the bottom surface of the depressed portion 60, and a cuboid second entrance-side block 56 arranged in parallel with the first entrance-side block 57 and longer than the first entrance-side block 57.

Figure 3:
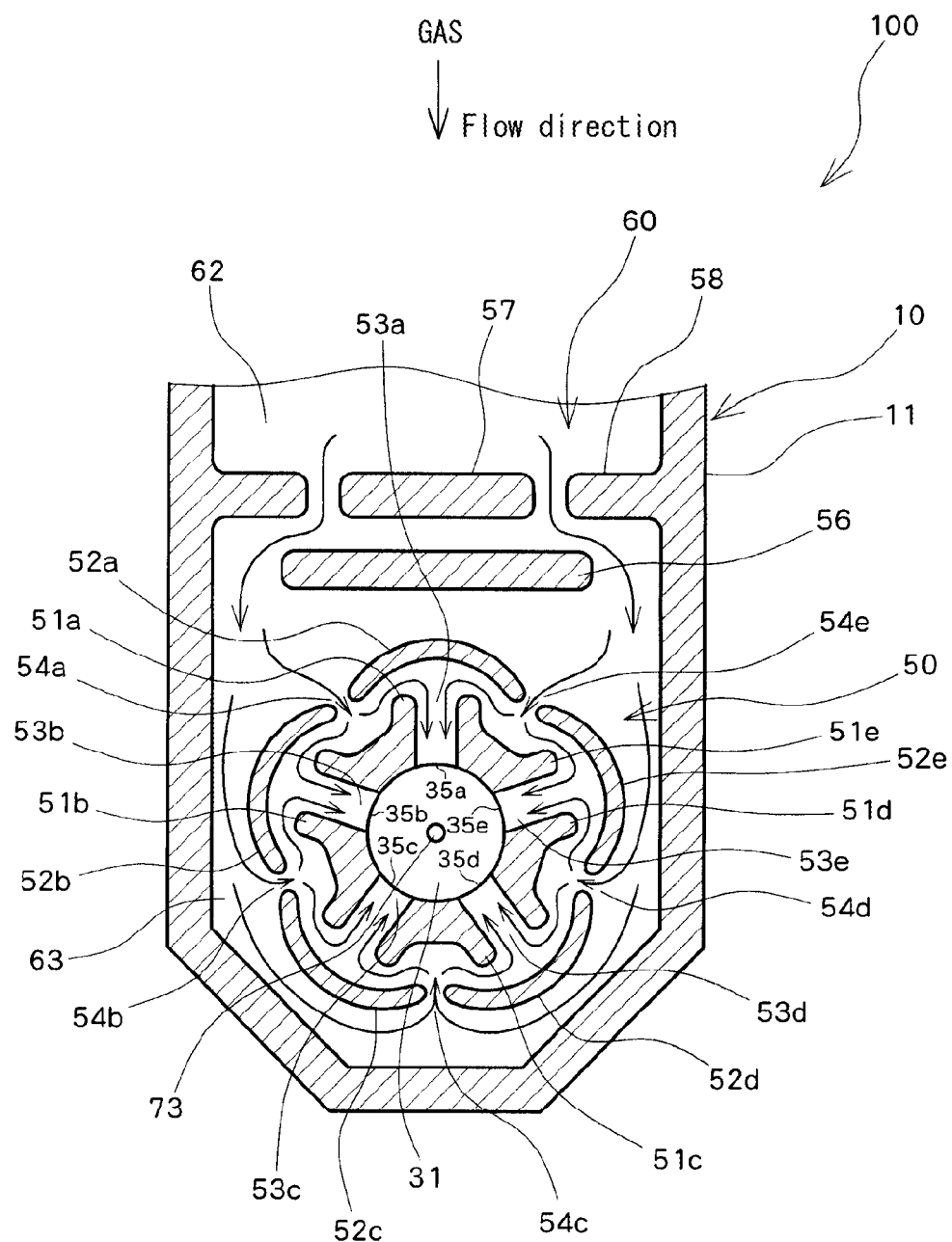
FIG. 3 is an illustrative view of an antioxidant gas flow path of the antioxidant gas supply unit according to the embodiment of the present invention.

As illustrated in FIG. 3, in this embodiment, the inner circumferential blocks 51 arranged around a peripheral rim of the hole 31 include five blocks of a first inner circumferential block 51a through a fifth inner circumferential block 51e, the outer circumferential blocks 52 includes five blocks of a first outer circumferential block 52a through a fifth outer circumferential block 52e.

Figure 4:
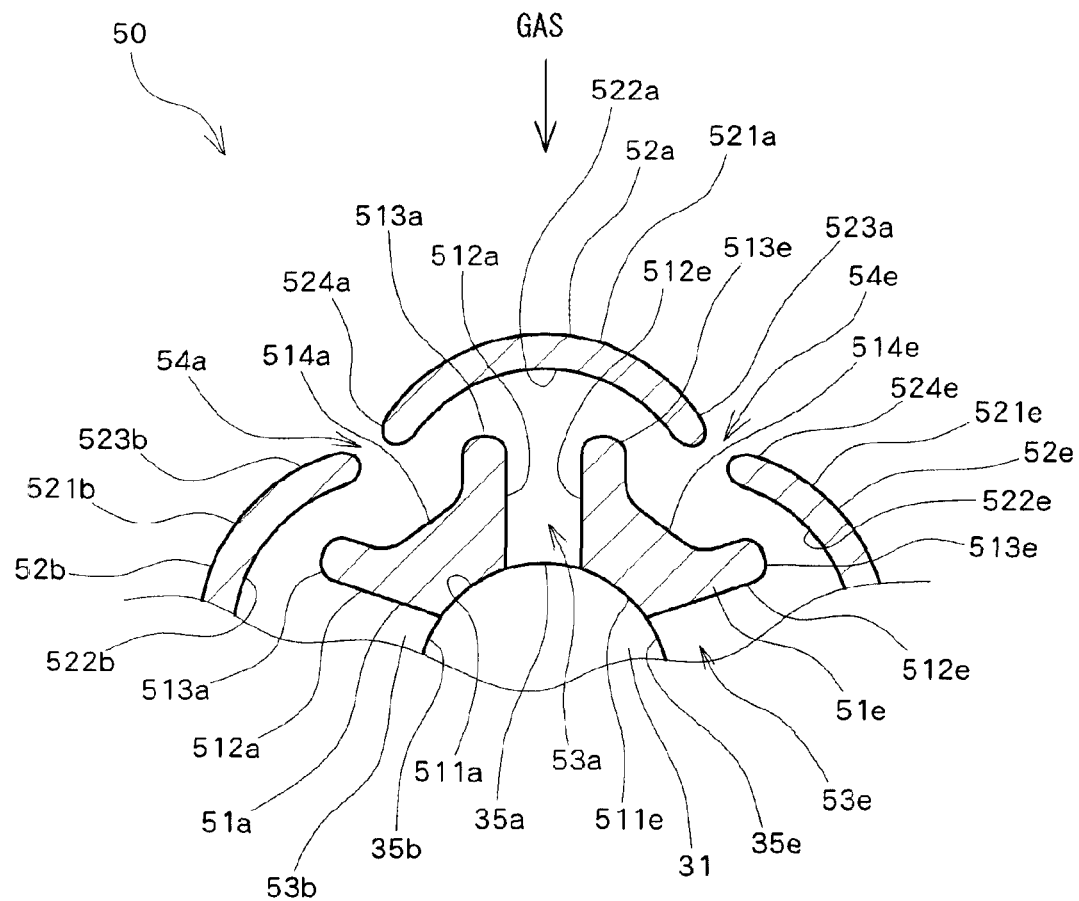
FIG. 4 is an enlarged view of the antioxidant gas flow path illustrated in FIG. 3.

As illustrated in FIG. 4, the first to fifth inner circumferential blocks 51a-51e are in a shape in which small projections are provided extending toward the outer circumference along portions corresponding to oblique sides of a substantial trapezoid. More specifically, each of the first to fifth inner circumferential blocks 51a-51e includes a corresponding one of inner surfaces 511a-511e that are sections of cylindrical surfaces along an outer circumference of the hole 31, corresponding ones of side surfaces 512a-512e on light and left sides extending from the corresponding inner surfaces 511a-511e toward the outer circumferential side, a corresponding one of planar outer surfaces 514a-514e facing against the respective inner surfaces 511a-511e, and corresponding ones of corners 513a-513e extending toward the outer circumferential side farther from the corresponding outer surfaces 514a-514e. The side surfaces 512a-512e of the first to fifth inner circumferential blocks 51a-51e are parallel to each other, and constitute antioxidant gas flow paths 53a-53e from the outer circumferential side of the first to fifth inner circumferential blocks 51a-51e toward the hole 31. Further, end surfaces of the antioxidant gas flow paths 53a-53e on the side of the hole 31 respectively constitute first to fifth air outlets 35a-35e, and the inner surfaces 511a-511e of the first to fifth inner circumferential blocks 51a-51e and the holes 31 and 32 respectively defined in the main body 11 and the cover 12 constitute the through hole 30 that penetrates through the base body 10.

On the outer circumferential side of the first to fifth inner circumferential blocks 51a-51e, the circular first to fifth outer circumferential blocks 52a-52e are provided. The first to fifth outer circumferential blocks 52a-52e are configured such that left-end portions 524a-524e and right-end portions 523a-523e take curvature so as to be directed toward the outer surfaces 514a-514e of the first to fifth inner circumferential blocks 51a-51e, respectively, and flow paths for letting the antioxidant gas flow are defined between the left-end portions 524a-524e, the right-end portions 523a-523e, and the corners 513a-513e of the first to fifth inner circumferential blocks 51a-51e. The gaps between the first to fifth outer circumferential blocks 52a-52e respectively constitute antioxidant gas flow paths 54a-54e. Then, positions of the antioxidant gas flow paths 54a-54e in the circumferential direction are displaced from positions of the antioxidant gas flow paths 53a-53e in the circumferential direction that are the gaps between the first inner circumferential block 51a to the fifth inner circumferential block 51e. According to this embodiment, the antioxidant gas flow paths 53a-53e and the antioxidant gas flow paths 54a-54e are arranged at the same central angle alternatingly with each other in the circumferential direction.

The antioxidant gas that is introduced into the entrance area 61 of the depressed portion 60 of the main body 11 from the antioxidant gas introducing tube 22 through the gas hole 21 and the antioxidation gas inlet 20 illustrated in FIG. 2 flows into the middle area 62 of the depressed portion 60 as indicated by arrows in FIG. 3, and enters the labyrinth area 63 of the depressed portion 60 from the middle area 62 after passing between the projections 58 and the first entrance-side block 57. The antioxidant gas entering the labyrinth area 63 is brought into contact with the second entrance-side block 56, changes its flow direction with the second entrance-side block 56 to the crosswise direction of the main body 11 to flow along the second entrance-side block 56, flows out through the second entrance-side block 56 and a side surface of the depressed portion 60 in the crosswise direction, and flows toward the labyrinth 50 constituted by the first to fifth inner circumferential blocks 51a-51e and the first to fifth outer circumferential blocks 52a-52e.

Then, as illustrated in FIG. 3, the antioxidant gas flows toward the hole 31 passing through the antioxidant gas flow paths 54a-54e constituted by the gaps between the first outer circumferential block 52a to the fifth outer circumferential block 52e, and is brought into contact with the outer surfaces 514a-514e of the first inner circumferential block 51a to the fifth inner circumferential block 51e to change its direction to a direction opposite from the direction toward the hole 31 (first change of the flow direction). Thereafter, the antioxidant gas flows around the corners 513a-513e illustrated in FIG. 4, enters the antioxidant gas flow paths 53a-53e constituted by the gaps between the first inner circumferential block 51a to the fifth inner circumferential block 51e (second change of the flow direction), passes through the antioxidant gas flow paths 53a-53e, and is blown out toward the center of the hole 31 from the first to fifth air outlets 35a-35e.

As illustrated in FIG. 2 and FIG. 3, the film heater 40 is attached to the cover 12 in a region corresponding to the labyrinth area 63 of the depressed portion 60 of the main body 11, and therefore the antioxidant gas that has entered the labyrinth area 63 is heated by the film heater 40. The labyrinth area 63 is provided with the labyrinth 50 that are configured with the first to fifth inner circumferential blocks 51a-51e and the first to fifth outer circumferential blocks 52a-52e so as to increase a surface for heating the antioxidant gas. Therefore, the antioxidant gas is effectively heated by the labyrinth 50 and blown out toward the center of the hole 31 from the first to fifth air outlets 35a-35e after heated up to an appropriate temperature.

Figure 5:
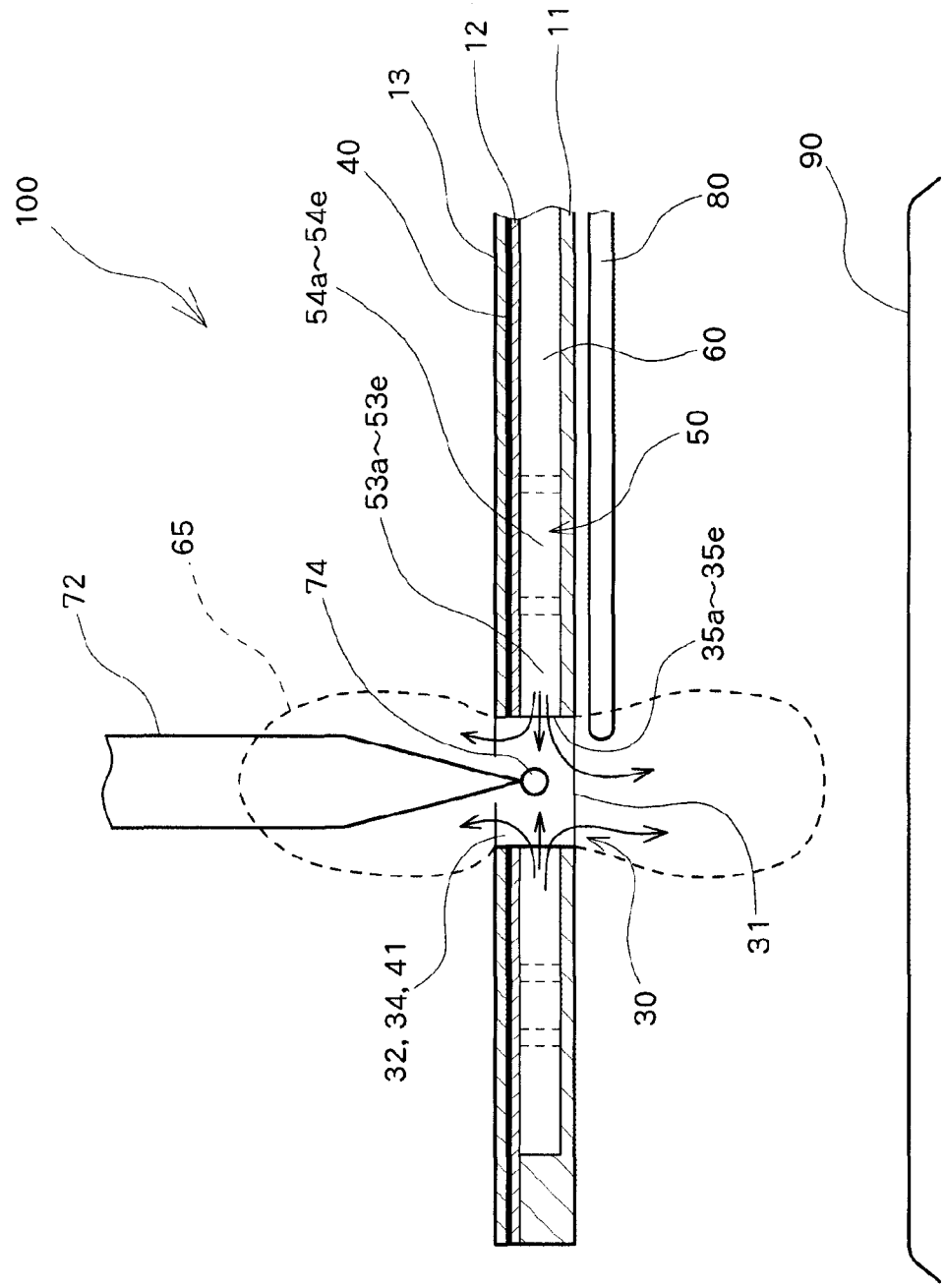
FIG. 5 is an illustrative view of the antioxidant gas supply unit according to the embodiment of the present invention in a state in which an antioxidant gas is blown.

As illustrated in FIG. 5, the antioxidant gas blown out from the first to fifth air outlets 35a-35e passes through the hole 31 in the main body 11 and flows out under the antioxidant gas supply unit 100 (a side of a substrate 90), and flows out above the antioxidant gas supply unit 100 through the holes 32, 41, and 34 respectively in the cover 12, the film heater 40, and the cover plate 13. Then, an antioxidant gas area 65 that spreads within the through hole 30 of the antioxidant gas supply unit 100 and under and above the antioxidant gas supply unit 100 is formed. Thereafter, a spark is generated between the electrode 80 and the wire tail 73 extending from the tip of the capillary 72, and a free air ball 74 is formed while suppressing oxidation of the wire tail 73.

As described with reference to FIG. 2 through FIG. 4, by changing the flow direction of the antioxidant gas at least two times, the labyrinth 50 is able to reduce a velocity component of the antioxidant gas flowing into the labyrinth area 63 of the depressed portion 60 in the direction toward the hole 31 from the antioxidation gas inlet 20, coordinate its direction so as to be directed toward the center of the hole 31 from the first to fifth air outlets 35a-35e, and equalizes a flow rate of the antioxidant gas that is blown out of the first to fifth air outlets 35a-35e. Therefore, the antioxidant gas area 65 spreading above and under the antioxidant gas supply unit 100 illustrated in FIG. 5 is substantially vertical along a direction of an axis of the capillary 72. Accordingly, a fluid force for moving the wire tail 73 or the free air ball 74 in a horizontal direction that is perpendicular to the axis of the capillary 72 is suppressed, and it is possible to prevent the free air ball 74 from decentering and to improve bonding qualities.

Further, the antioxidant gas supply unit 100 according to this embodiment has a thin plated structure, and is able to blow the antioxidant gas equally through the first to fifth air outlets 35a-35e. Therefore, even if the flow rate of the antioxidant gas is small, it is possible to form the antioxidant gas area 65 in a favorable manner and a sufficient heat exchange area is ensured by the labyrinth 50, and the temperature of the antioxidant gas can be heated by the lower-capacity film heater 40 up to about 100 degrees Celsius. With this, it is possible to heat the free air ball 74 appropriately to ensure bonding qualities. In addition, it is possible to provide such effects that the antioxidant gas supply unit 100 is provided in a compact structure and therefore can be easily incorporated in the wire bonding apparatus, and that bonding speed can be improved as high speed movement in the X and Y directions is enabled as the antioxidant gas supply unit is provided in a lightweight structure.

Moreover, according to this embodiment, the flow of the antioxidant gas is not decentered with the electrode 80 because the electrode 80 is positioned under the thin-plated antioxidant gas supply unit 100, and therefore it is possible to let the antioxidant gas blow out through the first to fifth air outlets 35a-35e in a more equalized manner, and to form the antioxidant gas area 65 in a favorable manner.

Figure 6:
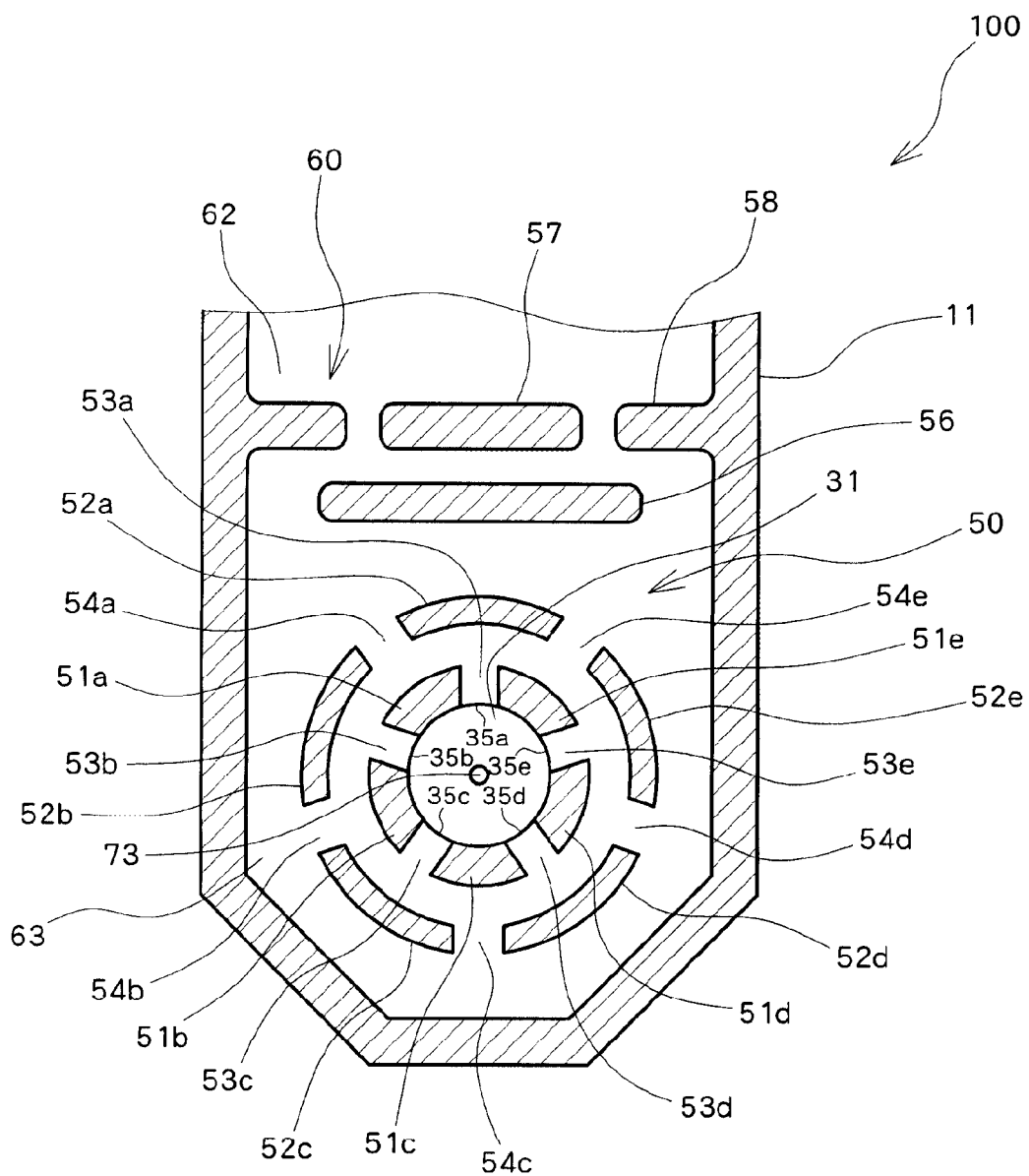
FIG. 6 is an illustrative view of an antioxidant gas flow path of an antioxidant gas supply unit according to a different embodiment of the present invention.

A different embodiment of the present invention will be described with reference to FIG. 6. Like components as those in the embodiment described with reference to FIG. 1 through FIG. 5 are denoted by like reference numerals, and their descriptions shall be omitted. According to the previously described embodiment, the first to fifth inner circumferential blocks 51a-51e are described to be in the shape in which there are provided the small corners 513a-513e extending toward the outer circumference along the portions corresponding to the oblique sides of the substantial trapezoid. However, depending on the flow rate of the antioxidant gas, the first to fifth inner circumferential blocks 51a-51e can be in a substantially trapezoidal shape as illustrated in FIG. 6, without having the corners 513a-513e. Further, according to the previously described embodiment, the first to fifth outer circumferential blocks 52a-52e are described to be configured such that left-end portions 524a-524e and right-end portions 523a-523e take curvature so as to be directed toward the outer surfaces 514a-514e of the first to fifth inner circumferential blocks 51a-51e, respectively. However, it is not necessary to take such a large curvature, and simple sections of an annular ring as illustrated in FIG. 6 can be arranged at regular intervals.

Moreover, while the labyrinth 50 is described to have a two-stage structure having the inner circumferential blocks 51 and the outer circumferential blocks 52, three or more stages of blocks may be provided around the hole 31. Further, the film heater 40 does not have to be a film as long as it is a thin heater, or it can be constituted a plurality of thin heaters scattered over the cover 12. This embodiment provides the same effects as those of the embodiment previously described with reference to FIG. 1 through FIG. 5.

Figure 7:
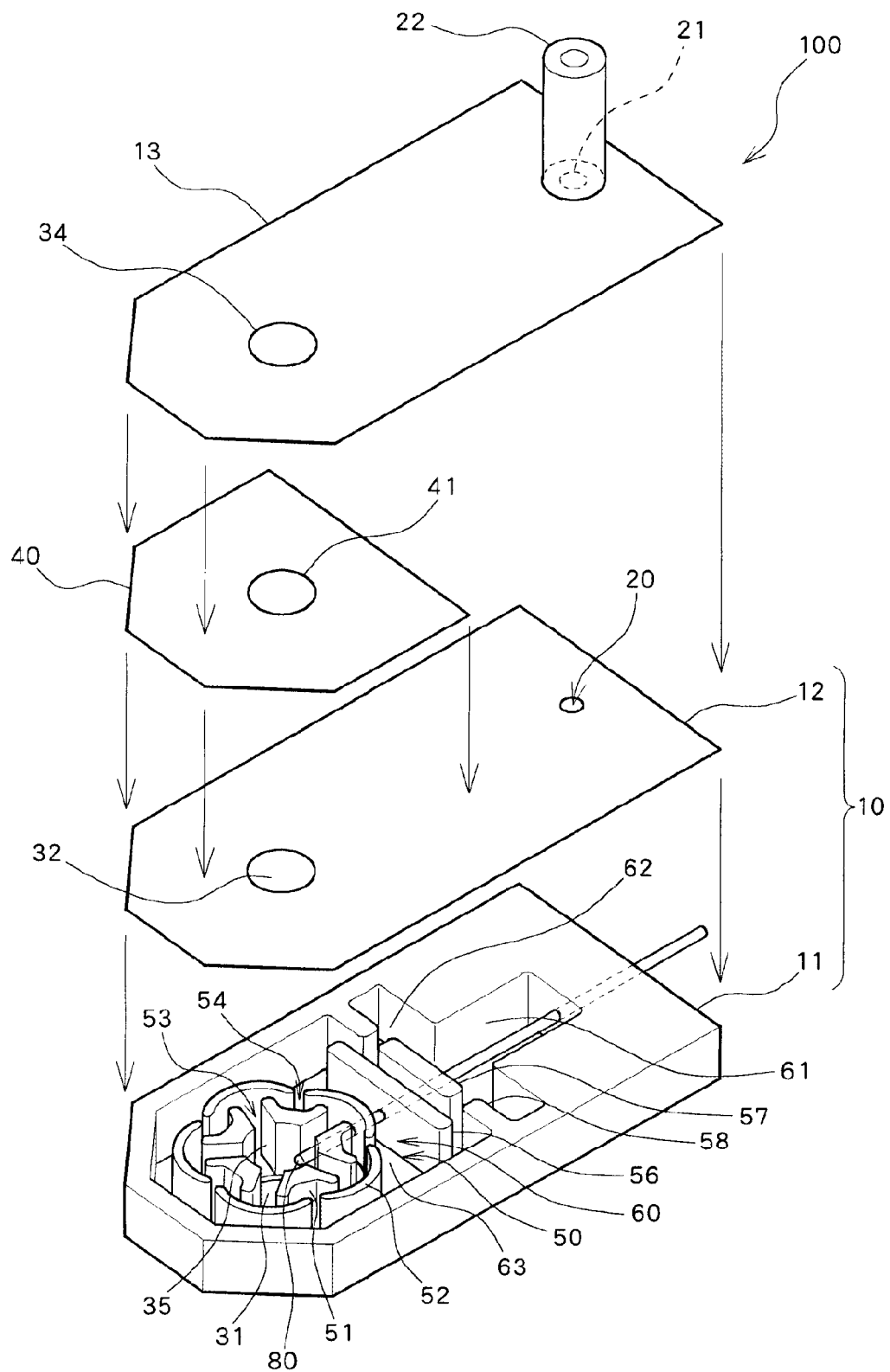
FIG. 7 is a perspective view illustrating a structure of an antioxidant gas supply unit according to a different embodiment of the present invention.
Figure 8:
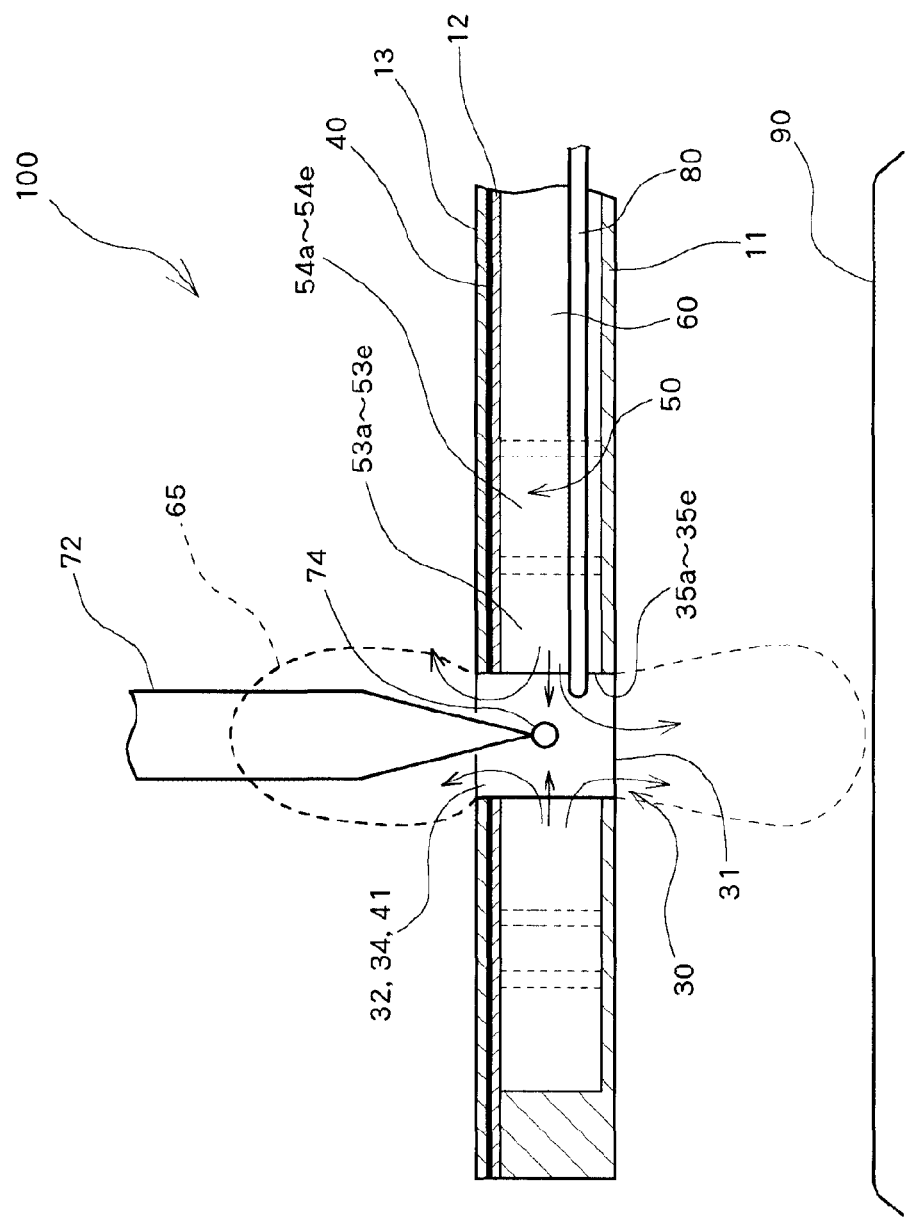
FIG. 8 is an illustrative view of the antioxidant gas supply unit according to the different embodiment of the present invention in a state in which an antioxidant gas is blown.

Next, another embodiment of the present invention will be described with reference to FIG. 7 and FIG. 8. Like components as those in the embodiments described with reference to FIG. 1 through FIG. 6 are denoted by like reference numerals, and their descriptions shall be omitted. In this embodiment, the electrode 80 is provided within the antioxidant gas supply unit 100 as illustrated in FIG. 7 and FIG. 8. As illustrated in FIG. 7 and FIG. 8, according to this embodiment, the electrode 80 is provided such that the electrode 80 is inserted from an end surface of the main body 11 in parallel with the surface of the main body, passes through the entrance area 61 of the depressed portion 60, penetrates through the first and the second entrance-side block 57 and 56 and one of the outer circumferential blocks 52, passes through the antioxidant gas flow path 53 between the inner circumferential blocks 51, and then reaches an upper surface of the hole 31. Further, as illustrated in FIG. 8, the electrode 80 is positioned lower than the vertical center within the depressed portion 60 of the main body 11. When the free air ball 74 at the tip of the capillary 72 is positioned at the center of the through hole 30 in the center of the main body 11 in the through-thickness direction, the electrode 80 is positioned so as to be slightly lower than the free air ball 74 and closer to the circumference of the through hole 30 than the free air ball 74 is. By placing the electrode 80 at this position, it is possible to form the free air ball 74 more favorably. The electrode 80 is removable and insertable from outside, and attached to the main body 11 so as to allow adjustment of a position of its tip.

This embodiment provides an effect that it is possible to suppress oxidation of the surface of the electrode 80 and to perform stable discharge for an extended period of time as the electrode 80 is provided within the antioxidant gas area 65, in addition to the same effects as those of the embodiments previously described with reference to FIG. 1 through FIG. 6.

The present invention is not limited to the embodiments described above, and includes any modifications and alterations without departing from the technical scope and the spirit of the present invention defined by the appended claims.

REFERENCE SIGNS LIST

10: Base Body
11: Main Body
12: Cover
13: Cover Plate
20: Antioxidation Gas Inlet
21: Gas Hole
22: Antioxidant Gas Introducing Tube
30: Through Hole
31, 32, 41, 34: Hole
35, 35a-35e: Antioxidant Gas Outlet
40: Film Heater
50: Labyrinth
51, 51a-51e: Inner Circumferential Blocks
52, 52a-52e: Outer Circumferential Blocks
53, 53a-53e, 54, 54a-54e: Antioxidant Gas Flow Path
56: Second Entrance-Side Block
57: First Entrance-Side Block
58: Projection
60: Depressed Portion
61: Entrance Area
62: Middle Area
63: Labyrinth Area
65: Antioxidant Gas Area
71: Bonding Arm
72: Capillary
73: Wire Tail
74: Free Air Ball
80: Electrode
90: Substrate
100: Antioxidant Gas Supply Unit Unit
511a-511e: Inner Surface
512a-512e: Side Surface
513a-513e: Corner
514a-514e: Outer Surface
523a-523e: Right-End Portion
524a-524e: Left-End Portion

The invention claimed is:

1. An antioxidant gas supply unit comprising:
a base body in a shape of a hollow plate having an antioxidant gas flow path defined therein;
a through hole penetrating through the base body in a through-thickness direction, so that a capillary is allowed to be inserted into and removed from the hole, and communicating with the antioxidant gas flow path to let an antioxidant gas flow out; and
a film heater attached to an outer surface of the base body around the through hole.

2. The antioxidant gas supply unit according to claim 1, wherein
the antioxidant gas flow path comprises a plurality of air outlets for blowing the antioxidant gas toward the center of the through hole.

3. The antioxidant gas supply unit according to claim 2, further comprising:
an antioxidation gas inlet for letting the antioxidant gas flow into the antioxidant gas flow path, wherein
the antioxidant gas flow path comprises a labyrinth for changing a flow direction at least two times and provided between the antioxidation gas inlet and the air outlets.

4. The antioxidant gas supply unit according to claim 3, wherein the labyrinth comprises:

a plurality of inner circumferential blocks arranged around a peripheral rim of the through hole, gaps between the blocks in a circumferential direction constituting the air outlets, respectively; and a plurality of outer circumferential blocks arranged on a side of an outer circumference of the inner circumferential blocks such that gaps between the blocks in the circumferential direction are displaced along the circumferential direction from the gaps between the inner circumferential blocks.

5. The antioxidant gas supply unit according to claim 3, wherein the film heater is attached to the outer surface of the base body in an area in which the labyrinth is disposed.

6. The antioxidant gas supply unit according to claim 4, wherein the film heater is attached to the outer surface of the base body in an area in which the labyrinth is disposed.

7. The antioxidant gas supply unit according to claim 1, further comprising an electrode disposed outside the base body, the electrode being provided for causing a spark between the electrode and a wire tail extending from a tip of the capillary to form the wire tail into a free air ball.

8. The antioxidant gas supply unit according to claim 1, further comprising an electrode disposed within the base body, the electrode being provided for causing a spark between the electrode and a wire tail extending from a tip of the capillary to form the wire tail into a free air ball.

* * * * *